US008830096B2

(12) United States Patent
Hu et al.

(10) Patent No.: US 8,830,096 B2
(45) Date of Patent: Sep. 9, 2014

(54) METHOD OF REDUCING WATER-WAVE NOISE AND SYSTEM THEREOF

(71) Applicant: NOVATEK Microelectronics Corp., Hsin-Chu (TW)

(72) Inventors: Po-Chin Hu, Hsinchu County (TW); Liming Xiu, Plano, TX (US)

(73) Assignee: NOVATEK Microelectronics Corp., Hsinchu Science Park, Hsin-Chu (TW)

(*) Notice: Subject to any disclaimer, the term of this patent is extended or adjusted under 35 U.S.C. 154(b) by 4 days.

(21) Appl. No.: 13/784,842

(22) Filed: Mar. 5, 2013

(65) Prior Publication Data

US 2014/0118173 A1  May 1, 2014

(30) Foreign Application Priority Data

Oct. 29, 2012 (TW) .............................. 101139972 A

(51) Int. Cl.
*H03M 1/00* (2006.01)
*H03M 1/12* (2006.01)
*H04L 27/26* (2006.01)
*H04L 25/06* (2006.01)

(52) U.S. Cl.
CPC ............. *H03M 1/12* (2013.01); *H04L 27/2647* (2013.01); *H04L 25/067* (2013.01); *H03M 1/00* (2013.01)
USPC .......................................... 341/123; 341/122

(58) Field of Classification Search
CPC ...... H03M 1/12; H03M 1/00; H04L 27/2647; H04L 25/067
USPC .................... 341/123, 122; 375/346, 260, 340
See application file for complete search history.

(56) References Cited

U.S. PATENT DOCUMENTS 7,672,407 B2 * 3/2010 Guo et al. ..................... 375/346

* cited by examiner

*Primary Examiner* — Joseph Lauture
(74) *Attorney, Agent, or Firm* — Winston Hsu; Scott Margo

(57) ABSTRACT

A method of reducing a water-wave noise for an analog to digital conversion includes performing sampling on an analog input signal; determining whether the analog input signal is interfered with by a periodic noise such that a water wave is generated; and executing one or both of the following steps when the analog input signal is interfered with by the periodic noise: adjusting a sampling frequency of the ADC, and adjusting a noise frequency of the periodic noise.

19 Claims, 11 Drawing Sheets

Fs=27Mhz, Fn=6.75Mhz

Fs=27Mhz, Fn=7Mhz

Fs=27Mhz, Fn=29Mhz

METHOD OF REDUCING WATER-WAVE NOISE AND SYSTEM THEREOF

BACKGROUND OF THE INVENTION

1. Field of the Invention

The present invention relates to a method of reducing a water-wave noise and a system thereof, and more particularly, to a method of reducing a water-wave noise and a system thereof capable of reducing water-wave noise for an analog to digital conversion by adjusting a sampling frequency and/or a noise frequency.

2. Description of the Prior Art

In a digital image system, an analog to digital converter (ADC) is utilized for converting an analog image signal into a digital format, in order to perform follow-up data processing and image displaying. Operations of the digital image system include performing sampling on an input analog image signal with a specific frequency, retrieving information related to image brightness and colors, and converting the information into the digital format to be outputted. The quality of the output images is influenced greatly during the sampling process due to the following two reasons: internal errors of the ADC generated from poor conversion linearity or clock offset, which may cause errors on sampling results; external noises generated from layout or configuration of system on a chip (SoC) or printed circuit board (PCB), where different methods of layout or configuration may exert influences of different magnitudes on the input signals of the ADC. Please refer to FIG. 1, which is a schematic diagram of an input signal of an ADC in an electronic system (e.g. a display) interfered with by an external noise. As shown in FIG. 1, after the analog input signal is interfered with by the external noise, the noise is combined with the original input signal and then sampled by the ADC, which may cause the quality of the output image to be damaged. In the SoC, the signals closest to the ADC (especially the clock signals) may interfere with the analog input signal of the ADC more easily.

Among the second type of noise/interference, one particular type of noise is called a water-wave noise. The water-wave noise is generated by a signal sampled by the ADC having periodic noise and transmitted to a display, such that ripples appear on the display continuously moving in the same direction like ripples on the surface of a lake; hence the name "water wave". Waveforms of the water-wave noise generated by the interfered analog input signal sampled by the ADC are illustrated in FIG. 2. As shown in FIG. 2, a periodic noise can be considered as a clock. A smooth analog input signal is interfered with by the periodic noise, and then sampled by the ADC with a specific sampling frequency. This generates the water-wave noise.

There have been many documents discussing the first type of noise/interference, with related solutions for enhancing the performance of the ADC. When the second type of noise/interference and especially the water-wave noise is encountered, however, the interference is usually prevented by modifying the layouts or configurations to isolate the source of noise as much as possible. Another solution comprises a method similar to time division multiplexing (TDM), which separates the time of transmitting the input signal and the time of transmitting the interference signal. These two solutions, however, may violate system requirements and always cause poor performance; especially in recent years, as systems are interfered with by noise more severely due to miniaturization of electronic products and processes. Therefore, there is a need to provide a method for preventing the quality of output images from being damaged by the water-wave noise.

SUMMARY OF THE INVENTION

It is therefore an objective of the present invention to provide a method of reducing a water-wave noise and a system using the same method capable of reducing the water-wave noise for an analog to digital conversion by adjusting a sampling frequency and/or a noise frequency.

An embodiment of the present invention discloses a method of reducing a water-wave noise for an analog to digital conversion. The method comprises performing sampling on an analog input signal; determining whether the analog input signal is interfered with by a periodic noise such that a water wave is generated; and executing one or both of the following steps when the analog input signal is interfered with by the periodic noise: adjusting a sampling frequency of the ADC, and adjusting a noise frequency of the periodic noise.

Another embodiment of the present invention discloses a system for reducing a water-wave noise. The system comprises an analog to digital converter (ADC), for performing sampling on an analog input signal; a noise determination unit, for determining whether the analog input signal is interfered with by a periodic noise such that a water wave is generated; and a frequency control module, for executing one or both of the following steps when the analog input signal is interfered with by the periodic noise: adjusting a sampling frequency of the ADC, and adjusting a noise frequency of the periodic noise.

Another embodiment of the present invention discloses a system for reducing a water-wave noise. The system comprises an analog to digital converter (ADC), for performing sampling on an analog input signal; a noise determination unit, for determining whether the analog input signal is interfered with by a periodic noise such that a water wave is generated; and a frequency control module, for selecting a sampling frequency from a plurality of selectable frequencies of the ADC, in order to prevent the water wave from being generated when the analog input signal is interfered with by the periodic noise.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
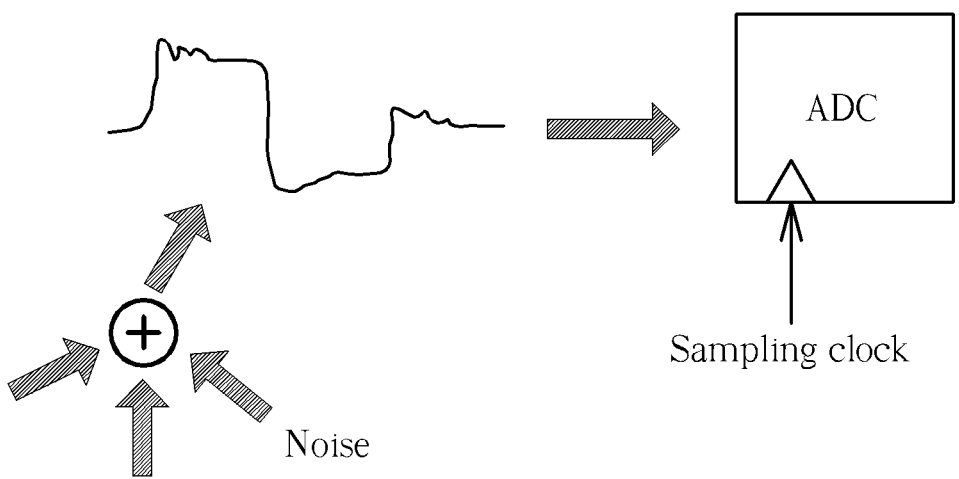
FIG. 1 is a schematic diagram of an input signal of an ADC in an electronic system interfered with by an external noise.
Figure 2:
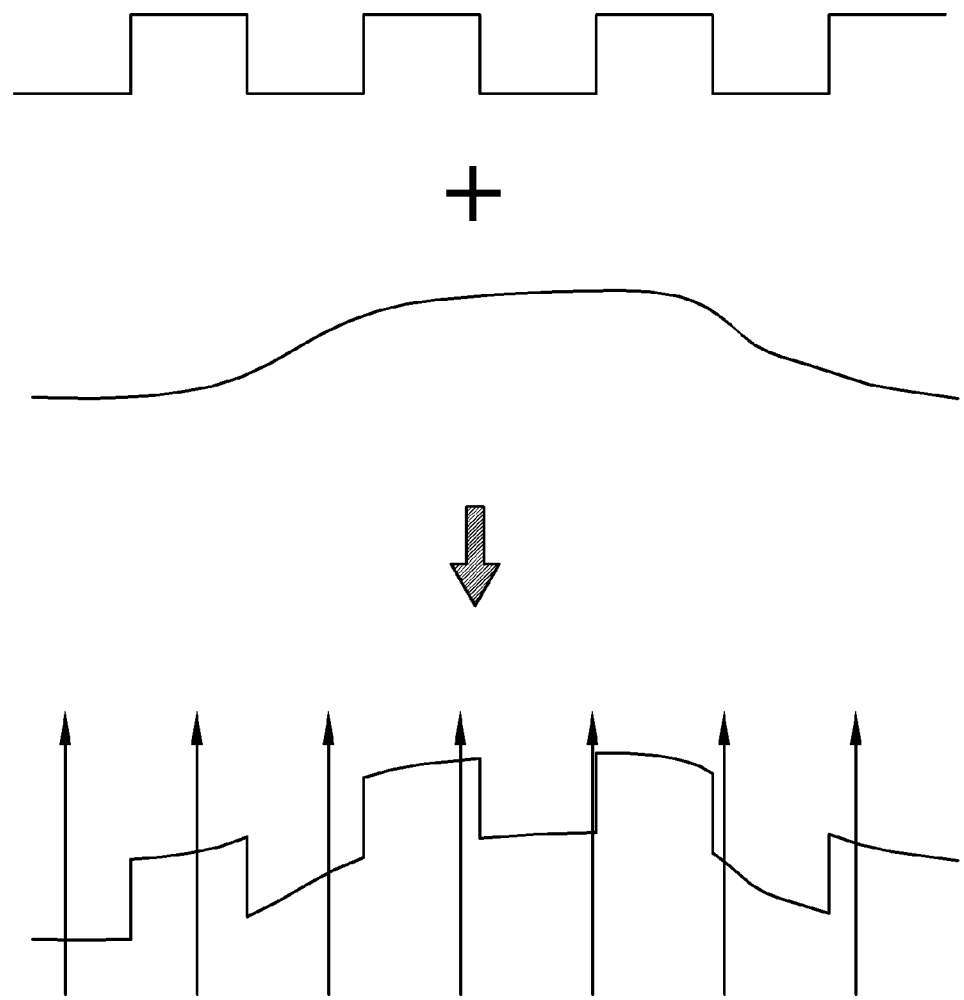
FIG. 2 is a waveform diagram of a water wave generated by periodic noise combined with an analog input signal sampled by the ADC.
Figure 3:
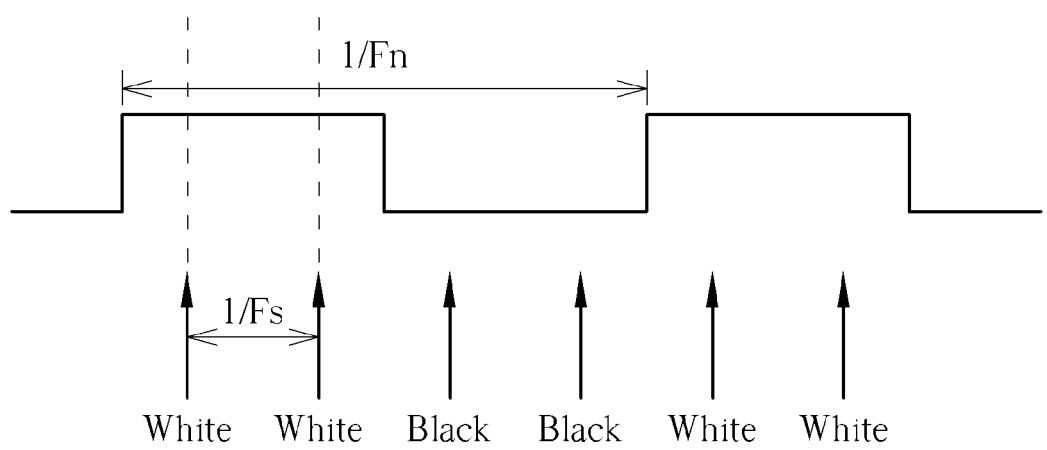
FIG. 3 is a waveform diagram of a water wave generated by an ADC performing sampling on a periodic noise.

Please refer to FIG. 3, which is a waveform diagram of a water wave generated by an analog to digital converter (ADC) performing sampling on a periodic noise. As shown in FIG. 3, the noise has periodicity, and thus can be considered as a clock. When the ADC performs sampling on the clock, a higher voltage level or a lower voltage level of the clock may be sampled. For easy reference, it is assumed that the sampling of the higher voltage level corresponds to white, and the sampling of the lower voltage level corresponds to black, which allows the sampling result to be transmitted to a display, such that a screen of the display shows a binary image with black and white. In general, display of each image is started from the first pixel (upper left corner of the screen), and swept from left to right and then from top to bottom, in order to display the sampling results in each of the pixels. After the last pixel (lower right corner of the screen) is displayed, display of the next image is started from the first pixel (upper left corner of the screen), and so on. The display of pixels may be performed from any other directions or from top to bottom and then from left to right; these are not limited herein.

Figure 4A:
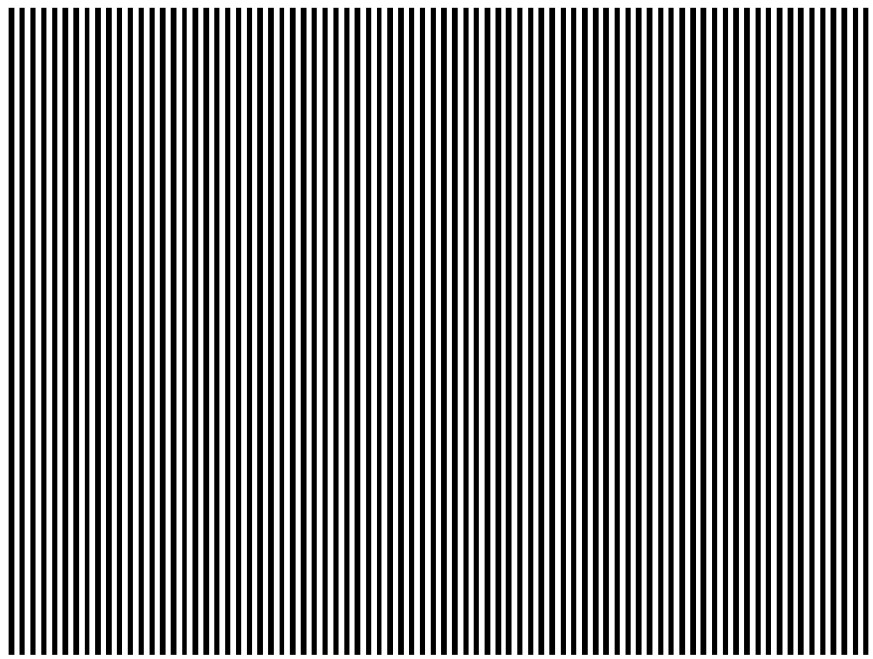
FIG. 4A to FIG. 4C are simulated diagrams of images originating from different water-wave noises according to an embodiment of the present invention.
Figure 4B:
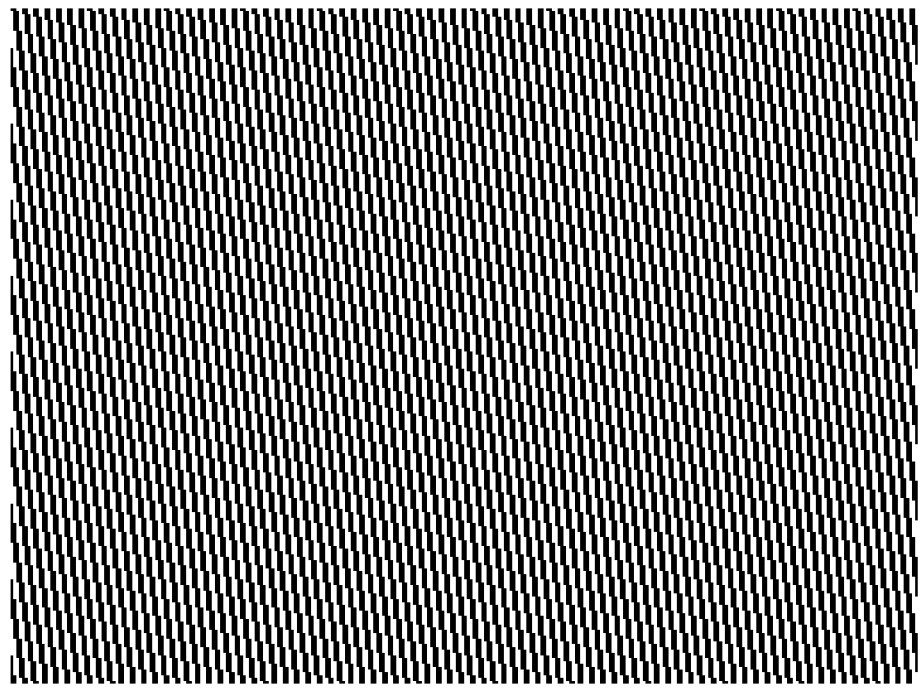
Figure 4C:
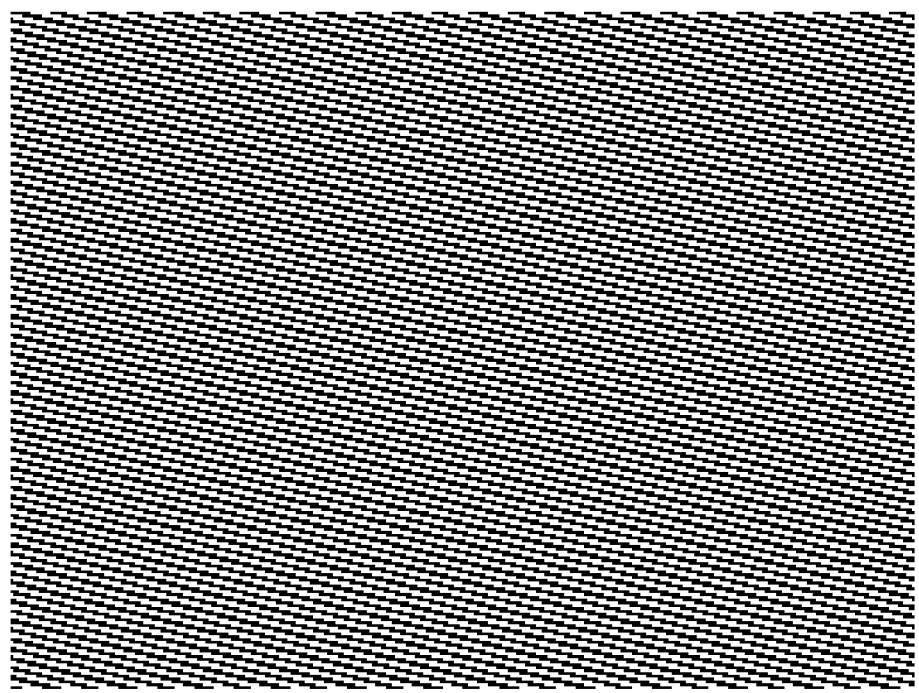

Different binary images with black and white represent different water-wave appearances and are illustrated in FIG. 4A to FIG. 4C. FIG. 4A to FIG. 4C are simulated diagrams of images originating from different water-wave noises according to an embodiment of the present invention. As shown in FIG. 4A to FIG. 4C, different noise frequencies Fn together with the same sampling frequency Fs may generate different water-wave noises. In FIG. 4A, the sampling frequency Fs is equal to 27 MHz, and the noise frequency Fn is equal to 6.75 MHz. Since the sampling frequency Fs is four times the noise frequency Fn, exactly four data are sampled in each clock cycle, and the sampled color may be circulated in an order of "white, white, black, black" where four pixels are displayed in each cycle. The pixels are displayed from left to right and then from top to bottom; hence the image appears to be vertical water waves. The sampled data is circulated with four pixels; hence for the same pixel, the sampled color of each image will be the same as that of the previous image, such that the displayed image may not change. As a result, the water wave on the screen will be stationary. At this moment, if the noise frequency is adjusted slightly, the displayed image may change, as shown in FIG. 4B. In FIG. 4B, the sampling frequency remains the same, i.e. Fs=27 MHz, but the noise frequency is fine tuned to Fn=7 MHz. The sampling frequency Fs and the noise frequency Fn are not in an integer relationship; hence different amounts of data may be sampled in each clock cycle, such that the water wave displayed on the screen may be oblique. For the same pixel, the sampled color of each image may be different from that of the previous image. As a result, the water wave on the screen may not be stationary. In practice, the water wave may look like it is moving toward the same direction continuously.

Figure 5:
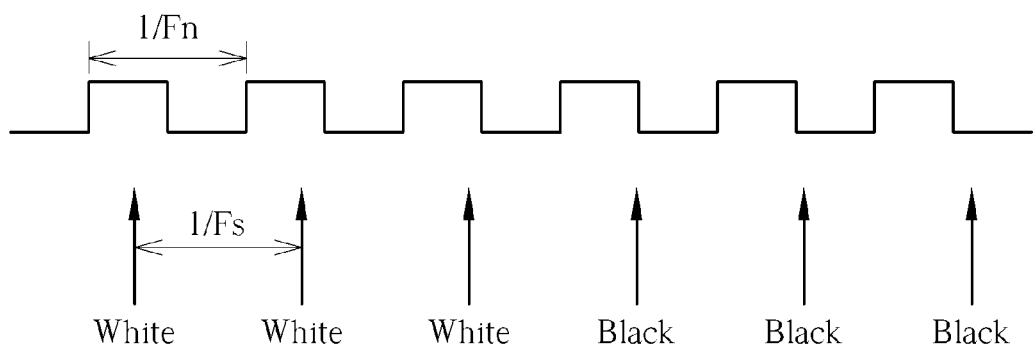
FIG. 5 is a waveform diagram of a water wave generated by another ADC performing sampling on another periodic noise.

The noise frequency Fn can be adjusted to be greater than the sampling frequency Fs, as shown in FIG. 4C. In FIG. 4C, the sampling frequency remains the same, i.e. Fs=27 MHz, and the noise frequency rises to Fn=29 MHz. The sampling frequency Fs and the noise frequency Fn are not in an integer relationship; hence different amount of data may be sampled in each clock cycle, such that the water wave displayed on the screen may be oblique. As shown in FIG. 5, when the noise frequency Fn is close to the sampling frequency Fs, there is a longer series of higher voltage level data (white) being sampled, and then a longer series of lower voltage level data (black) being sampled. As a result, an oblique water wave with greater gradient may appear, as shown in FIG. 4C. Similarly, the water wave may look like it is moving toward the same direction continuously.

Figure 6:
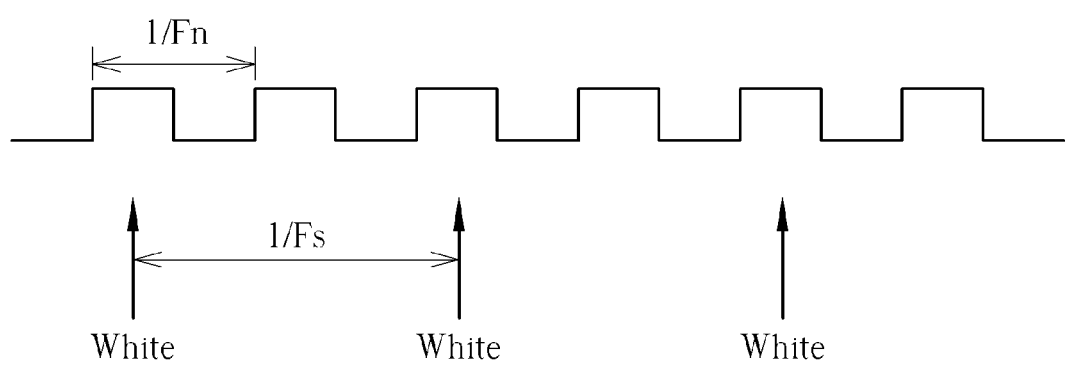
FIG. 6 is a schematic diagram of sampling when the noise frequency is a multiple of the sampling frequency.

According to the above illustration, when the sampling frequency Fs is a multiple of the noise frequency Fn, the water-wave noise may be stationary; while when the sampling frequency Fs and the noise frequency Fn are not in an integer relationship, the water-wave noise may move toward the same direction continuously. If the noise frequency Fn is a multiple of the sampling frequency Fs, the water-wave noise may not appear. Please refer to FIG. 6, which is a schematic diagram of sampling when the noise frequency Fn is a multiple of the sampling frequency Fs. In FIG. 6, the sampled data are all higher voltage level (white), and the noise frequency Fn is double that of the sampling frequency Fs. If there is no offset in the sampling clock Fs, the sampled data will all be higher voltage level (white) and may not change. Similarly, the sampled data may all be lower voltage level (black) and may not change. As a result, the water-wave noise may not appear on the displayed image. In the same manner, when the noise frequency Fn is equal to the sampling frequency Fs, the sampled data may all be higher voltage level (white), or all be lower voltage level (black), of which the principle is the same as in the above case where the noise frequency Fn is a multiple of the sampling frequency Fs; this is therefore not narrated herein. According to a general principle, when there are N pixels in an image, if the noise frequency Fn and the sampling frequency Fs satisfy a relationship that N*Fn/Fs is an integer, the water wave can be avoided.

Please note that the human vision is more sensitive to moving objects and less sensitive to stationary ones, such that stationary water-wave noises are usually invisible, but moving water-wave noises may generate interference easily. The present invention can therefore control the noise frequency Fn and the sampling frequency Fs to satisfy the relationship that N*Fn/Fs is an integer by adjusting the noise frequency Fn and/or the sampling frequency Fs, in order to reduce or avoid the interference of the water-wave noise. For example, if the noise frequency Fn is a multiple of the sampling frequency Fs, or the noise frequency Fn is equal to the sampling frequency Fs, the water-wave noise may not appear. Similarly, other relationships between the noise frequency Fn and the sampling frequency Fs can also be implemented, as long as the water-wave noise will not appear.

Figure 7:
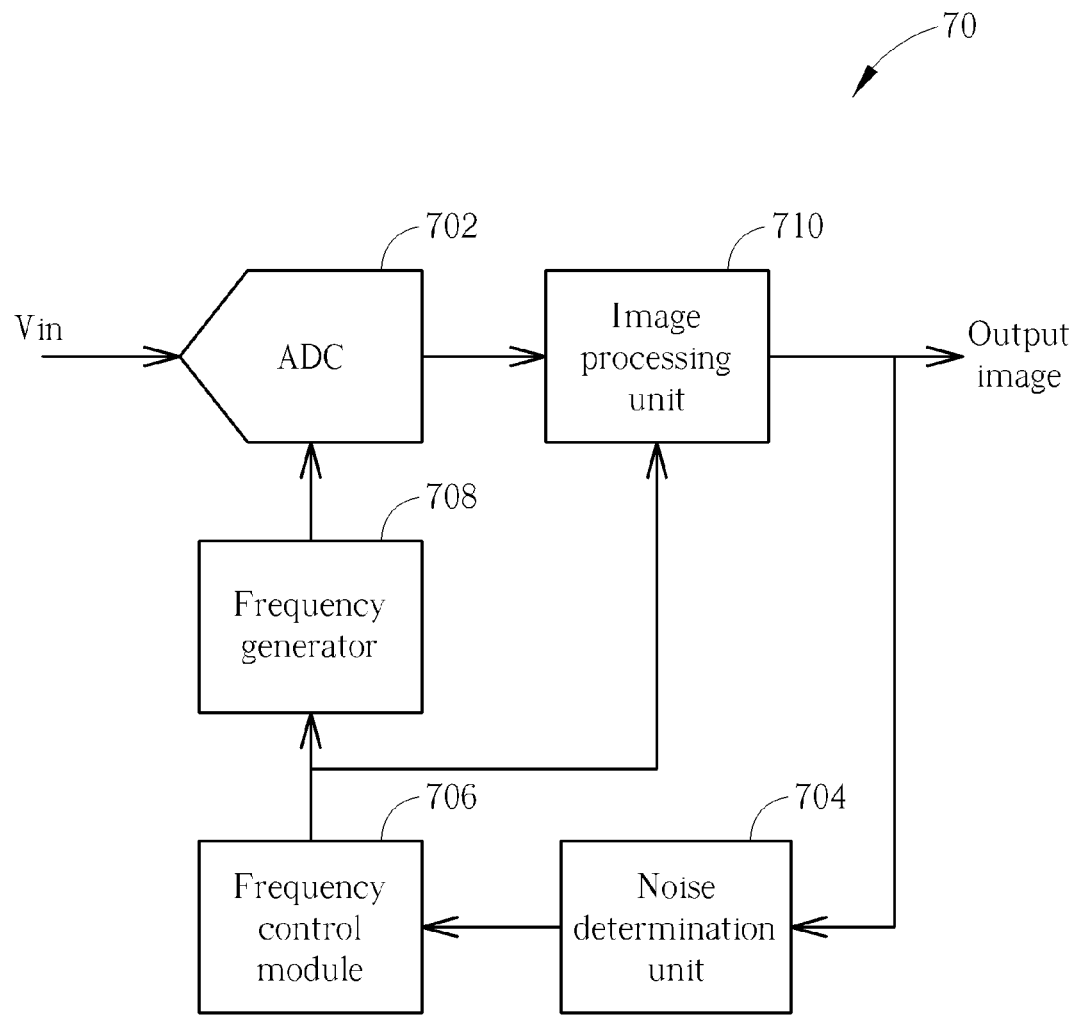
FIG. 7 is a schematic diagram of a water-wave noise reducing system according to an embodiment of the present invention.

Please refer to FIG. 7, which is a schematic diagram of a water-wave noise reducing system 70 according to an embodiment of the present invention. The water-wave noise reducing system 70 includes an ADC 702, a noise determination unit 704, a frequency control module 706, a frequency generator 708 and an image processing unit 710. The ADC 702 receives an analog input signal Vin and performs sampling on the analog input signal Vin, and then the image processing unit 710 performs image processing according to the sampled signal. The image processing unit 710 includes one or more filters. The noise determination unit 704 is utilized for determining whether the analog input signal Vin received by the ADC 702 is interfered with by the water-wave noise, which can be realized by a frequency analyzer, and is not limited herein. For example, when the frequency analyzer determines that the magnitude of some frequency component in the output signal of the ADC 702 exceeds a predetermined value, if the frequency does not belong to the original signal in itself, it can be considered as interference of the water-wave noise. The frequency control module 706 is utilized for adjusting the frequency generated by the frequency generator 708, and adjusting coefficients of the corresponding filter in the image processing unit 710. The frequency generator 708 can generate a clock with a specific frequency through a phase-locked loop (PLL) or in other manners, in order to provide the ADC 702 for performing sampling. In general, the clock generated by the PLL may possess a frequency with higher accuracy, and is capable of accurately controlling the sampling frequency Fs to be in an integer relationship with Fn.

Figure 8:
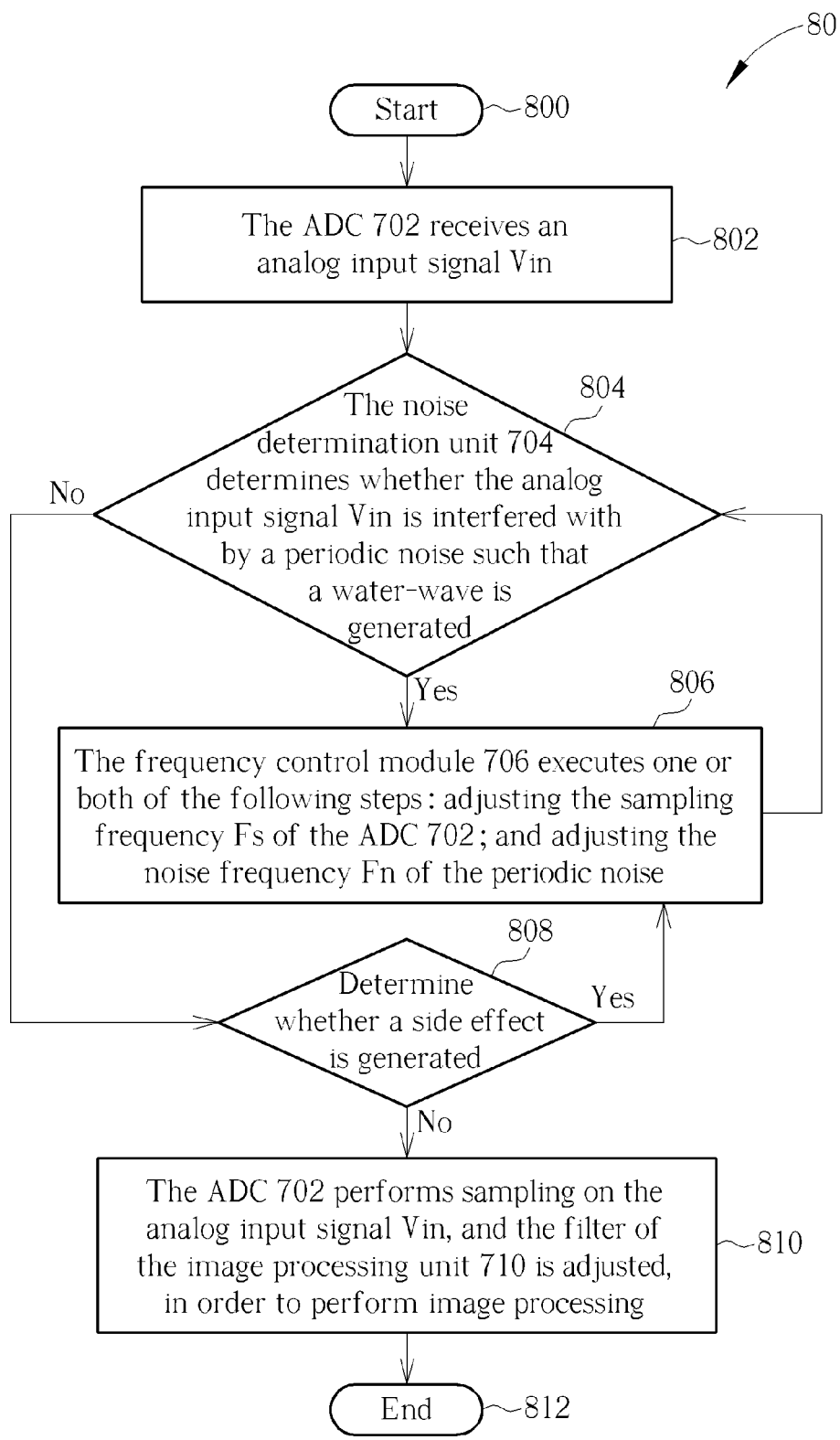
FIG. 8 is a block diagram of a water-wave noise reducing process according to an embodiment of the present invention.

The operations of adjusting the noise frequency Fn and the sampling frequency Fs in order to reduce the water-wave noise can be summarized into a water-wave noise reducing process 80. As shown in FIG. 8, the water-wave noise reducing process 80 includes the following steps:

Step 800: Start.

Step 802: The ADC 702 receives an analog input signal Vin.

Step 804: The noise determination unit 704 determines whether the analog input signal Vin is interfered with by a periodic noise such that a water wave is generated. If yes, go to Step 806; otherwise, go to Step 808.

Step 806: The frequency control module 706 executes one or both of the following steps: adjusting the sampling frequency Fs of the ADC 702; and adjusting the noise frequency Fn of the periodic noise. Then go to Step 804.

Step 808: Determine whether a side effect is generated. If yes, go to Step 806; otherwise, go to Step 810.

Step 810: The ADC 702 performs sampling on the analog input signal Vin, and the filter of the image processing unit 710 is adjusted, in order to perform image processing.

Step 812: End.

According to the water-wave noise reducing process 80, the ADC 702 first receives the analog input signal Vin. The noise determination unit 704 then determines whether the received analog input signal Vin is interfered with by the periodic noise such that a water wave is generated. When the analog input signal Vin is interfered with (i.e. magnitude of some redundant frequency component exceeds a predetermined value), the frequency control module 706 may adjust the sampling frequency Fs of the ADC 702, i.e. make the sampling frequency Fs and the noise frequency Fn satisfy the relationship that N*Fn/Fs is an integer. On the other hand, if the source of the water-wave noise is known and its frequency can be adjusted, the noise frequency Fn of the water-wave noise can also be adjusted by the frequency control module 706 or in other manners, i.e. by making the sampling frequency Fs and the noise frequency Fn satisfy the relationship that N*Fn/Fs is an integer.

After the adjustment of frequency is accomplished, the system further checks whether a side effect is generated under the operation with the values of the sampling frequency Fs and the noise frequency Fn. The side effect may be generated due to incompatibility of the system. For example, the water-wave noise may be generated from clocks utilized by other circuits of the system. When the noise frequency Fn changes, functions of partial circuits may be influenced, such that the entire system may malfunction. In addition, if the sampling frequency Fs is adjusted substantially and far from the specification of the filter in the image processing unit 710, the digital image signal may not be outputted accurately.

Figure 9:
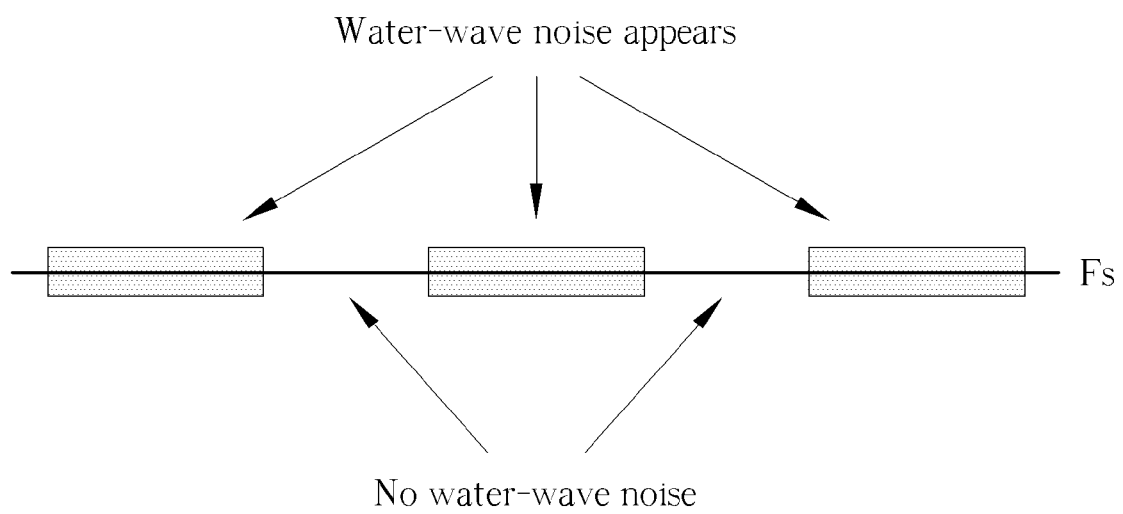
FIG. 9 is a schematic diagram of the sampling frequency adjusted according to the water-wave noise.

According to the above illustration, when the sampling frequency Fs and the noise frequency Fn satisfy the relationship that N*Fn/Fs is an integer, interference of the water-wave noise can be avoided. Therefore, various combinations of values of the sampling frequency Fs and the noise frequency Fn can be utilized, in order to prevent the interference of the water-wave noise from being generated. Please refer to FIG. 9, which is a schematic diagram of the sampling frequency Fs adjusted according to the water-wave noise. As shown in FIG. 9, when the noise frequency Fn is fixed, the water-wave noise may appear if the value of the sampling frequency Fs locates within partial ranges, and may not appear if the value of the sampling frequency Fs locates within other ranges. Therefore, when the noise frequency Fn is fixed, many possible frequency values can be adjusted for the sampling frequency Fs to prevent the water-wave noise from being generated. By the same token, when the sampling frequency Fs is fixed, possible frequency values can be adjusted for the noise frequency Fn to prevent the water-wave noise from being generated. As a result, when the side effect is generated, the sampling frequency Fs and/or the noise frequency Fn can be re-adjusted, i.e. by making the sampling frequency Fs and the noise frequency Fn satisfy the relationship that N*Fn/Fs is another integer, in order to prevent the analog input signal Vin from being interfered with by the water-wave noise. The system then determines whether a side effect is generated again. When there is no side effect generated, the ADC 702 can perform sampling on the analog input signal Vin, and then the coefficients of the filter in the image processing unit 710 are adjusted, in order to perform image processing according to the sampled signal.

Please note that the spirit of the above embodiment is to avoid or reduce the water-wave noise by adjusting the sampling frequency Fs and/or the noise frequency Fn. Those skilled in the art can make modifications or alterations accordingly. For example, in addition to adjusting the sampling frequency Fs and/or the noise frequency Fn by the frequency control module 706, these frequencies may also be modified in other manners. For example, the sampling frequency Fs may be selected from a plurality of selectable frequencies, and a plurality of selectable filters are implemented in the image processing unit 710 corresponding to the plurality of selectable frequencies, respectively. The plurality of selectable filters may also be stored in the frequency control module 706, or realized apart in the water-wave noise reducing system 70; these are not limited herein. When one selectable frequency is selected as the sampling frequency Fs, a filter converting device may be utilized for selecting the corresponding filter. The filter converting device may be realized in the frequency control module 706, realized in the image processing unit 710, or realized apart in the water-wave noise reducing system 70, which are not limited herein. After a selectable frequency is selected as the sampling frequency Fs, the noise determination unit 704 determines whether the analog input signal Vin is interfered with such that the water-wave noise is generated. If yes, another selectable frequency may be selected as the sampling frequency Fs; otherwise, the system further determines whether a side effect is generated. When a side effect is generated, the frequency control module 706 then selects another selectable frequency as the sampling frequency Fs, until the water-wave noise disappears and no side effect is generated; this frequency can be utilized for performing sampling on the analog input signal Vin. The filter of the image processing unit 710 then performs filtering, in order to perform the follow-up image processing.

In the prior art, when the interference of the water-wave noise is encountered, it is usually prevented by modifying the layouts or configurations to isolate the source of noise as much as possible. Otherwise, a method similar to time division multiplexing (TDM) may be utilized, which separates the time of transmitting the input signal and the time of transmitting the interference signal. These two solutions, however, may violate system requirements and always cause poor performance. In comparison, the above embodiments of the present invention are capable of making the sampling frequency and the noise frequency satisfy the integer relationship by adjusting the sampling frequency and/or the noise frequency, in order to avoid or reduce the interference of the water-wave noise.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of reducing a water-wave noise for an analog to digital conversion, the method comprising:
   performing sampling on an analog input signal;
   determining whether the analog input signal is interfered with by a periodic noise such that a water wave is generated; and
   executing one or both of the following steps when the analog input signal is interfered with by the periodic noise:
   adjusting a sampling frequency of the ADC, and
   adjusting a noise frequency of the periodic noise.

2. The method of claim 1, wherein the ADC comprises a plurality of selectable frequencies, and the method further comprises selecting a selectable frequency from the plurality of selectable frequencies as the sampling frequency.

3. The method of claim 1, wherein the step of adjusting the noise frequency of the periodic noise comprises adjusting a frequency of a clock when the periodic noise originates from the clock.

4. The method of claim 1, wherein the step of adjusting the sampling frequency of the ADC comprises adjusting the sampling frequency of the ADC to a specific frequency, such that the specific frequency and the noise frequency satisfy a relationship that N*Fn/Fs is an integer, wherein Fn denotes the noise frequency, Fs denotes the sampling frequency, and N denotes pixel numbers of an image.

5. The method of claim 4, further comprising:
   adjusting the sampling frequency again when a side effect is generated after the sampling frequency of the ADC is adjusted to the specific frequency.

6. The method of claim 1, wherein the step of adjusting the noise frequency of the periodic noise comprises adjusting the noise frequency of the periodic noise to a specific frequency, such that the specific frequency and the sampling frequency satisfy a relationship that N*Fn/Fs is an integer, wherein Fn denotes the noise frequency, Fs denotes the sampling frequency, and N denotes pixel numbers of an image.

7. The method of claim 6, further comprising:
   adjusting the noise frequency again when a side effect is generated after the noise frequency of the periodic noise is adjusted to the specific frequency.

8. A system for reducing a water-wave noise, comprising:
   an analog to digital converter (ADC), for performing sampling on an analog input signal;
   a noise determination unit, for determining whether the analog input signal is interfered with by a periodic noise such that a water wave is generated; and
   a frequency control module, for executing one or both of the following steps when the analog input signal is interfered with by the periodic noise:
   adjusting a sampling frequency of the ADC; and
   adjusting a noise frequency of the periodic noise.

9. The system of claim 8, wherein the ADC comprises a plurality of selectable frequencies, in order for the system to select a selectable frequency from the plurality of selectable frequencies as the sampling frequency.

10. The system of claim 8, wherein the frequency control module adjusts a frequency of a clock when the periodic noise originates from the clock.

11. The system of claim 8, wherein the frequency control module adjusts the sampling frequency of the ADC to a specific frequency, such that the specific frequency and the noise frequency satisfy a relationship that N*Fn/Fs is an integer, wherein Fn denotes the noise frequency, Fs denotes the sampling frequency, and N denotes pixel numbers of an image.

12. The system of claim 11, wherein the frequency control module adjusts the sampling frequency again when a side effect is generated after the frequency control module adjusts the sampling frequency of the ADC to the specific frequency.

13. The system of claim 8, wherein the frequency control module adjusts the noise frequency of the periodic noise to a specific frequency, such that the specific frequency and the sampling frequency satisfy a relationship that N*Fn/Fs is an integer, wherein Fn denotes the noise frequency, Fs denotes the sampling frequency, and N denotes pixel numbers of an image.

14. The system of claim 13, wherein the frequency control module adjusts the noise frequency again when a side effect is generated after the frequency control module adjusts the noise frequency of the periodic noise to the specific frequency.

15. A system for reducing a water-wave noise, comprising:
   an analog to digital converter (ADC), for performing sampling on an analog input signal;
   a noise determination unit, for determining whether the analog input signal is interfered with by a periodic noise such that a water wave is generated; and
   a frequency control module, for selecting a sampling frequency from a plurality of selectable frequencies of the ADC, in order to prevent the water wave from being generated when the analog input signal is interfered with by the periodic noise.

16. The system of claim 15, wherein the frequency control module comprises:
   a frequency generator, for generating the plurality of selectable frequencies;
   a frequency selecting device, for selecting a selectable frequency from the plurality of selectable frequencies as the sampling frequency to provide for the ADC;
   a plurality of filters, for performing filtering on a signal generated by a sampling of the ADC, wherein filtering frequencies of the plurality of filters correspond to the plurality of selectable frequencies, respectively; and
   a filter converting device, for selecting a filter from the plurality of filters, wherein the filter has a filtering frequency corresponding to the sampling frequency.

17. The system of claim 16, wherein the frequency generator generates the plurality of selectable frequencies by using a phase-locked loop (PLL).

18. The system of claim 15, wherein the frequency control module selects a specific frequency from the plurality of selectable frequencies of the ADC as the sampling frequency, such that the specific frequency and the noise frequency satisfy a relationship that N*Fn/Fs is an integer, wherein Fn denotes the noise frequency, Fs denotes the sampling frequency, and N denotes pixel numbers of an image.

19. The system of claim 18, wherein the frequency control module selects the sampling frequency from the plurality of selectable frequencies of the ADC again when a side effect is generated after the frequency control module selects the specific frequency from the plurality of selectable frequencies of the ADC as the sampling frequency.

* * * * *